United States Patent
Lee et al.

(10) Patent No.: US 12,280,961 B2
(45) Date of Patent: Apr. 22, 2025

(54) METHOD AND DEVICE FOR CONTROLLING OVERHEAD HOIST TRANSFER VEHICLE

(71) Applicant: SEMES CO., LTD., Cheonan-si (KR)

(72) Inventors: Jun Beom Lee, Hwaseong-si (KR); Yeong Jae Choe, Hwaseong-si (KR); Dong Hoon Yang, Anyang-si (KR); Jeong Eun Kim, Cheongju-si (KR)

(73) Assignee: SEMES CO., LTD., Cheonan-si (KR)

( * ) Notice: Subject to any disclaimer, the term of this patent is extended or adjusted under 35 U.S.C. 154(b) by 1172 days.

(21) Appl. No.: 17/066,671

(22) Filed: Oct. 9, 2020

(65) Prior Publication Data
US 2021/0107745 A1 Apr. 15, 2021

(30) Foreign Application Priority Data
Oct. 11, 2019 (KR) .................. 10-2019-0126145

(51) Int. Cl.
| | | |
|---|---|---|
| B65G 43/02 | (2006.01) | |
| B65G 1/04 | (2006.01) | |
| H01L 21/67 | (2006.01) | |
| H01L 21/677 | (2006.01) | |

(52) U.S. Cl.
CPC ........... *B65G 43/02* (2013.01); *B65G 1/0457* (2013.01); *H01L 21/67259* (2013.01); *H01L 21/67733* (2013.01); *B65G 2203/0283* (2013.01); *B65G 2203/0291* (2013.01)

(58) Field of Classification Search
CPC ............... B65G 43/02; B65G 1/0457; B65G 2203/0283; B65G 2203/0291; H01L 21/67259; H01L 21/67733
See application file for complete search history.

(56) References Cited

U.S. PATENT DOCUMENTS

| | | |
|---|---|---|
| 5,511,487 A | 4/1996 | Sakagami et al. |
| 2012/0175334 A1* | 7/2012 | Chen ................. B66C 19/00 212/71 |
| 2018/0099817 A1 | 4/2018 | Murakami |

FOREIGN PATENT DOCUMENTS

| | | |
|---|---|---|
| CN | 1111196 | 11/1995 |
| KR | 10-2018-0040483 | 4/2018 |
| KR | 10-1980277 B | 5/2019 |

(Continued)

OTHER PUBLICATIONS

Michael Quinlan, Tsz-Chiu Au, Jesse Zhu, Nicolae Stiurca, Peter Stone, Bringing Simulation to Life: A Mixed Reality Autonomous Intersection, Proceedings of IROS 2010-IEEE/RSJ International Conference on Intelligent Robots and Systems, (IROS 2010), Taipei, Taiwan, Oct. 2010. (Year: 2010).*

(Continued)

*Primary Examiner* — Aryan E Weisenfeld

(57) ABSTRACT

A method and a device for controlling an OHT vehicle are proposed. The method and device presents a solution in which it is possible to minimize a repetition of start and stop of a vehicle, due to congestion on a track, by providing a buffer distance or a buffer waiting time, when the control target vehicle starts due to moving out of range of a proximity distance to a preceding vehicle, after stopping according to reaching of the proximity distance to the preceding vehicle, during driving the OHT control target vehicle.

14 Claims, 11 Drawing Sheets

(56) References Cited

FOREIGN PATENT DOCUMENTS

TW    M310155      4/2007
WO    2018110178   6/2018

OTHER PUBLICATIONS

Ryota Horiguchi & Takashi Oguchi, A Study on Car Following Models Simulating Various Adaptive Cruise Control Behaviors, Int. J. ITS Res. (2014) 12:127-134 DOI 10.1007/s13177-013-0077-5 (Year: 2014).*
Horiguchi et al. (Year: 2014).*
Quinlan et al. (Year: 2010).*
Office Action from the China National Intellectual Property Administration dated Jun. 29, 2023.

* cited by examiner

METHOD AND DEVICE FOR CONTROLLING OVERHEAD HOIST TRANSFER VEHICLE

CROSS REFERENCE TO RELATED APPLICATION

The present application claims priority to Korean Patent Application No. 10-2019-0126145, filed Oct. 11, 2019, the entire contents of which is incorporated by reference herein for all purposes.

BACKGROUND OF THE INVENTION

Field of the Invention

The present disclosure relates to a method and device for controlling an Overhead Hoist Transfer (OHT) vehicle. More particularly, the present disclosure is intended to present a solution in which a repetition of start and stop of a vehicle due to congestion on a track may be minimized by providing a buffer distance or a buffer waiting time, when a control target vehicle starts due to moving out of range of a proximity distance to a preceding vehicle, after stopping according to reaching the proximity distance to the preceding vehicle, during driving the OHT control target vehicle.

Description of the Related Art

In a manufacturing process of semiconductor products, hundreds of processes are performed up to completing finished products, and hundreds of thousands of cargo movement occur in the process of performing the semiconductor manufacturing operation. In order to prevent contamination and damage to semiconductor materials, and to prevent delivery accidents during the cargo transfer process, a semiconductor manufacturing line uses an OHT (Overhead Hoist Transfer) as a cargo transfer automation system. The OHT is a system that automates cargo transfer between numerous semiconductor processes, and plays a role to transport wafers contained in FOUP (Front Opening Unified Pod) to the manufacturing facilities for each of the manufacturing processes along the lines installed on the ceiling.

FIGS. 1A and 1B are views showing schematic configuration diagrams of a cargo transfer automation system to which OHT is applied.

An OHT 30 drives on a track 40 installed on the ceiling, and is interfaced in a wireless communication method with an OCS (OHT Control System) that issues a transfer operation command. From a MCS (Material Control System) 10, the OCS 20 receives a transfer command according to a work process, searches for the shortest route from a starting point to a destination in order to enable the OHT 30 to complete the transfer operation in the shortest time in accordance with a command of the MCS 10, selects an OHT in an optimal position suitable for performing the transfer operation, and then issues the transfer command. In addition, the OHT 30 selected in accordance with the transfer command of the OCS 20 transfers cargo from an arbitrary port commanded by the OCS 20 to a destination port.

On a track, several tens to hundreds of OHT vehicles are driving in accordance with the transfer commands, and even though driving is performed according to an optimal route search, a section of proximity driving between the OHT vehicles is inevitably generated. In particular, a bottleneck phenomenon of the OHT vehicles occurs in a branch section 50 on the track. In this case, a collision accident between the OHT vehicles may occur, and a control technology that maintains a proximity distance between a preceding vehicle and a following vehicle is provided to prevent the collision accident, and FIGS. 2A and 2C are views showing conceptual diagrams of the related art regarding collision avoidance control between the OHT vehicles according to the related art.

As shown in FIG. 2A, the following vehicle 70 measures distance to the preceding vehicle 60 through a preceding vehicle detection sensor while the preceding vehicle 60 and the following vehicle 70 are driving on the same track 40, and as shown in FIG. 2B, in the case where the following vehicle 70 reach a proximity threshold distance A that is preset with the preceding vehicle 60, the following vehicle 70 decelerates and stops in order to prevent a collision.

Thereafter, as shown in FIG. 2C, when the preceding vehicle 60 starts and runs so that a separation distance between the preceding vehicle 60 and the following vehicle 70 exceeds the proximity threshold distance A, the following vehicle 70 starts and runs again.

As described above, in order to prevent a collision accident between the preceding vehicle and the following vehicle, control is performed for the stopping and starting of the following vehicle according to the proximity threshold distance between the preceding vehicle and the following vehicle.

The stability of the system may be ensured by such a collision avoidance control, but stopping and starting of the vehicle due to the proximity distance between OHT vehicles in a congestion section or a bottleneck section constantly occur, whereby vibrations are generated on the system. In particular, an acceleration section posing immediately after the start of the OHT vehicle is a non-linear operation section for the control, in which larger vibrations are generated, and in the case of instantaneous stop of the OHT vehicle by decelerating as soon as accelerating, since a change in the acceleration is reversed from a positive (+) value to a negative (−) value, jerking is generated due to the instantaneous reverse action, whereby a much greater shock is applied to the load.

As such vibrations or shocks are accumulated, there occurs a problem in that the life of a system requiring precise control is shortened and an operation error occurs.

The foregoing is intended merely to aid in the understanding of the background of the present disclosure, and is not intended to mean that the present disclosure falls within the purview of the related art that is already known to those skilled in the art.

Documents of Related Art (Patent Document 1) Korea Patent Application Publication No. 10-1980277

SUMMARY OF THE INVENTION

The present disclosure is to solve the problems of the related art as described above, and the present disclosure aims to solve a problem in that vibrations are generated by constant stopping and starting that constantly occur due to a proximity distance between OHT vehicles in a congestion section or a bottleneck section of the OHT vehicles and, in particular, to solve a problem in that a shock is applied to a load by jerking due to an instantaneous reverse action in a section where the OHT vehicle stops instantaneously by decelerating as soon as accelerating.

To this end, the present disclosure is intended to suggest a solution to minimize a repetition of start and stop of an OHT vehicle, in a congestion section or a bottleneck section on a track, by providing a buffer distance or a buffer waiting time to a following vehicle, when a preceding vehicle starts, after the following vehicle stops according to reaching of the proximity distance to the preceding vehicle, during driving the OHT vehicles.

According to the present disclosure to achieve the above technical problem, an exemplary embodiment of a method of controlling an OHT vehicle includes: stopping a control target vehicle in which a vehicle motion controller decelerates and stops the control target vehicle as the control target vehicle reaches a proximity threshold distance to a preceding vehicle; and starting the control target vehicle in which the vehicle motion controller starts the control target vehicle as a separation distance between the control target vehicle and the preceding vehicle exceeds a start separation distance considering a buffer distance or a buffer waiting time.

Here, the buffer distance may be set based on start acceleration of the preceding vehicle.

The stopping of the control target vehicle may include: receiving a detection signal, in accordance with a detection default set as the proximity threshold distance, from a preceding vehicle detector installed on the control target vehicle, and decelerating and stopping the control target vehicle, and wherein the starting of the control target vehicle may include: receiving a detection signal of exceeding the proximity threshold distance, in accordance with the detection default, from the preceding vehicle detector; maintaining the stopping of the control target vehicle during the buffer waiting time based on the start acceleration of the preceding vehicle; and starting the control target vehicle according to the exceeding of the start separation distance due to elapse of the buffer waiting time.

The buffer waiting time may be calculated by an equation $$T_s = \sqrt{\frac{L_S}{a_F}},$$

where $T_s$ is the buffer waiting time, $L_S$ is the buffer distance, and $a_F$ is the acceleration of the preceding vehicle.

The stopping of the control target vehicle may include: receiving a detection signal, in accordance with a stop detection default based on the proximity threshold distance, from a preceding vehicle detector installed on the control target vehicle, and decelerating and stopping the control target vehicle; and resetting a detection default of the preceding vehicle detector as a start detection default based on the start separation distance obtained by adding the buffer distance to the proximity threshold distance, and the starting of the control target vehicle may include: receiving a detection signal of exceeding the start separation distance, in accordance with the start detection default, from the preceding vehicle detector, and starting the control target vehicle; and resetting the detection default of the preceding vehicle detector as the stop detection default.

Moreover, the method may further include: starting vehicle operation in which the vehicle motion controller may receive a stop detection default setting command based on the proximity threshold distance, together with an operation command of the control target vehicle, from an OCS that establishes an operation plan of an OHT and operates the OHT vehicle, may set a detection default of a preceding vehicle detector as a stop detection default, and may start operation of the control target vehicle, wherein the stopping of the control target vehicle may include: receiving a detection signal of reaching the proximity threshold distance, in accordance with the stop detection default, from the preceding vehicle detector to decelerate and stop the control target vehicle, and transmitting a vehicle stop report to the OCS; and receiving a start detection default setting command, based on the start separation distance obtained by adding the buffer distance to the proximity threshold distance, from the OCS, and resetting the detection default of the preceding vehicle detector as the start detection default, and the starting of the control target vehicle may include: receiving a detection signal of exceeding the start separation distance, in accordance with the start detection default, from the preceding vehicle detector to start the control target vehicle, and transmitting a vehicle start report to the OCS; and receiving the stop detection default setting command from the OCS, and resetting the detection default of the preceding vehicle detector as the stop detection default.

Here, in the stopping of the control target vehicle, the vehicle motion controller may extract start detection default information held in accordance with the start detection default setting command from the OCS, and in the starting of the control target vehicle, the vehicle motion controller may extract stop detection default information held in accordance with the stop detection default setting command from the OCS.

Alternately, in the stopping of the control target vehicle, the vehicle motion controller may receive start detection default information together with the start detection default setting command from the OCS, and in the starting of the control target vehicle, the vehicle motion controller may receive stop detection default information together with the stop detection default setting command from the OCS.

Moreover, the method may further include: setting a detection default in which the sensor controller of a preceding vehicle detector installed on the control target vehicle sets a stop detection default and a start detection default on the basis of the proximity threshold distance to the preceding vehicle and the start separation distance from the preceding vehicle, wherein, in the stopping of the control target vehicle, the vehicle motion controller may decelerate and stop the control target vehicle on the basis of a detection signal, in accordance with the stop detection default, from the preceding vehicle detector, and in the starting of the control target vehicle, the vehicle motion controller may start the control target vehicle on the basis of a detection signal, in accordance with the start detection default, from the preceding vehicle detector.

In the setting of the detection default, the stop detection default may be set based on the proximity threshold distance and the start detection default is set based on the start separation distance obtained by adding the buffer distance to the proximity threshold distance.

In addition, according to the present disclosure, an exemplary embodiment of a device for controlling an OHT vehicle includes: a preceding vehicle detector that detects a separation distance from a preceding vehicle; and a vehicle motion controller that controls operation of a control target vehicle on the basis of a preceding vehicle detection signal of the preceding vehicle detector, wherein stopping and starting of the control target vehicle is controlled based on a proximity threshold distance to the preceding vehicle and a start separation distance from the preceding vehicle.

The vehicle motion controller may decelerate and stop the control target vehicle according to reaching of the proximity threshold distance to the preceding vehicle, and may start the control target vehicle as the separation distance between the control target vehicle and the preceding vehicle exceeds the start separation distance considering a buffer distance or a buffer waiting time.

Here, the buffer distance may be set based on start acceleration of the preceding vehicle.

Furthermore, the preceding vehicle detector may detect the preceding vehicle in accordance with a detection default set as the proximity threshold distance and may transmit a detection signal to the vehicle motion controller, and the vehicle motion controller may provide a buffer waiting time based on the start acceleration of the preceding vehicle, and may start the control target vehicle according to the exceeding of the start separation distance, when a detection signal exceeding the proximity threshold distance in accordance with the detection default is transmitted from the preceding vehicle detector.

The buffer waiting time may be calculated by an equation $$T_s = \sqrt{\frac{L_S}{a_F}},$$

where $T_s$ is the buffer waiting time, $L_S$ is the buffer distance, and $a_F$ is acceleration of the preceding vehicle.

Furthermore, the vehicle motion controller may include a detection default setter that may selectively set a detection default for preceding vehicle detection of the preceding vehicle detector according to an operation condition of the control target vehicle.

The detection default setter may set a stop detection default on the basis of the proximity threshold distance when the control target vehicle is operated, and may set a start detection default on the basis of the start separation distance when the control target vehicle is stopped.

In addition, the detection default setter may receive a detection default setting command from the OCS that may operate an OHT by establishing an operation plan of the OHT and may set the detection default of the preceding vehicle detector, and wherein when the control target vehicle is operated, the detection default setter may transmit a vehicle start report to the OCS and may receive a stop detection default setting command from the OCS, and when the control target vehicle is stopped, the detection default setter may transmit a target vehicle stop report to the OCS and may receive a start detection default setting command from the OCS.

As an example, the detection default setter may extract stop detection default information held in accordance with the stop detection default setting command from the OCS, and may extract start detection default information held in accordance with the start detection default setting command from the OCS.

Furthermore, according to the present disclosure, a device for controlling an OHT vehicle includes: a preceding vehicle detector provided with one or more detection sensors for sensing a separation distance from a preceding vehicle, and generating a detection signal according to detection of a distance to the preceding vehicle on the basis of a detection default set as a proximity threshold distance to the preceding vehicle; and a vehicle motion controller for decelerating and stopping a control target vehicle according to a detection signal, in accordance with reaching of the proximity threshold distance to the preceding vehicle, from the preceding vehicle detector, and for starting the control target vehicle by providing a buffer waiting time according to a detection signal, in accordance with moving out of range of the proximity threshold distance to the preceding vehicle, from the preceding vehicle detector, wherein the buffer waiting time is calculated by an equation $$T_s = \sqrt{\frac{L_S}{a_F}},$$

where $T_s$ is the buffer waiting time, $L_S$ is a buffer distance, and $a_F$ is acceleration of the preceding vehicle.

According to the present disclosure, it is possible to minimize a repetition of start and stop of OHT vehicles, in the congestion section or the bottleneck section on the track, by providing the buffer distance or the buffer waiting time to a following vehicle, when the following vehicle starts as the preceding vehicle moves out of range of the proximity threshold distance, after the following vehicle stops according to reaching of the proximity distance to the preceding vehicle, during driving the OHT vehicles.

In particular, it is possible to solve a problem in that vibrations are generated by stopping and starting that constantly occur due to the proximity distance between OHT vehicles in a congestion section or a bottleneck section of the OHT vehicles, and to solve a problem in that a shock is applied to a load by jerking caused by instantaneous reverse action according to reversal of an acceleration change in the section where an OHT vehicle stops instantaneously by decelerating as soon as accelerating.

Furthermore, through the present disclosure, by reducing the stress applied to the OHT system requiring precise control, it is possible to increase durability of the OHT system and to solve a problem in that an operation error of the OHT vehicle occurs.

DETAILED DESCRIPTION OF THE INVENTION

Figure 1A:
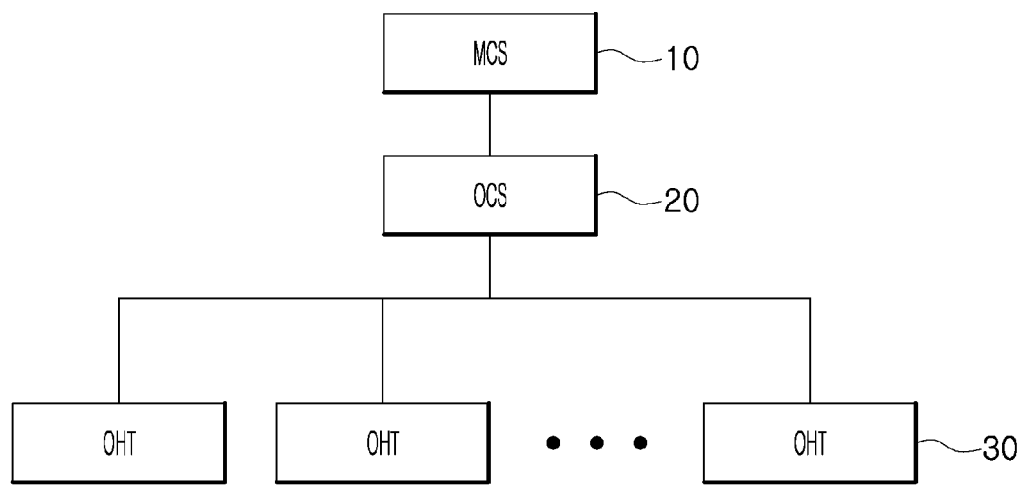
FIGS. 1A and 1B are views showing schematic configuration diagrams and exemplary embodiments of a cargo transfer automation system to which OHT is applied.
Figure 1B:
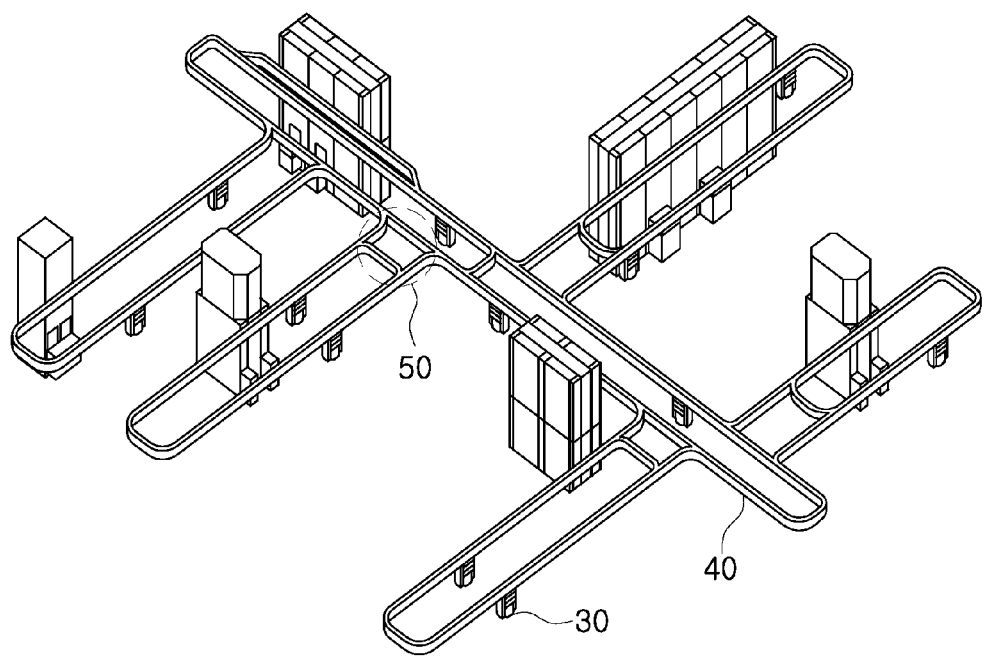
Figure 2A:
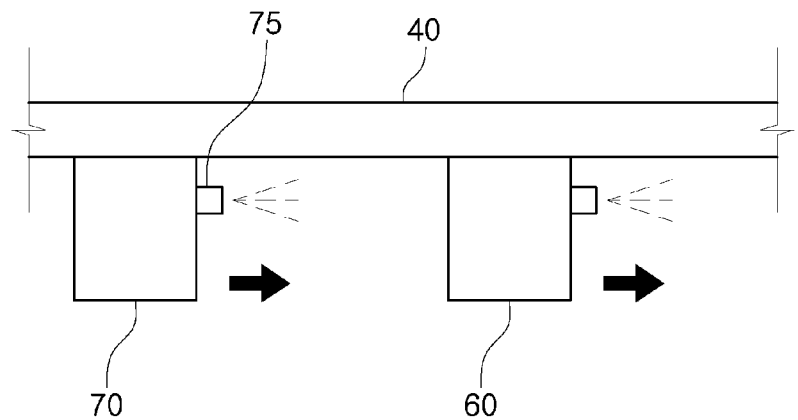
FIGS. 2A to 2C are views showing conceptual diagrams of the related art for collision avoidance control between OHT vehicles.
Figure 2B:
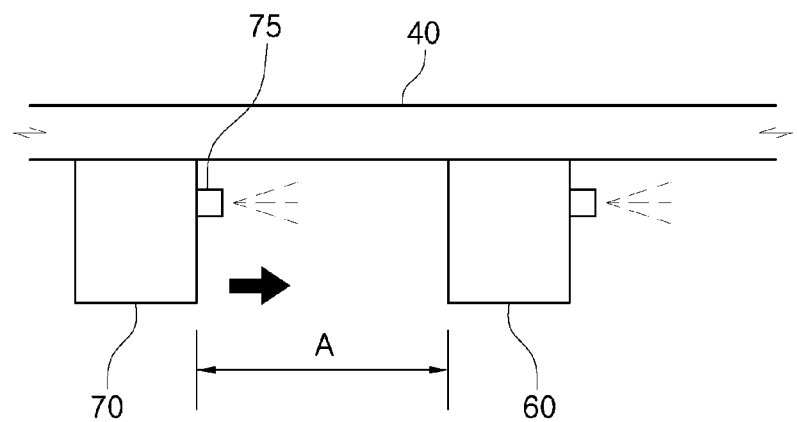
Figure 2C:
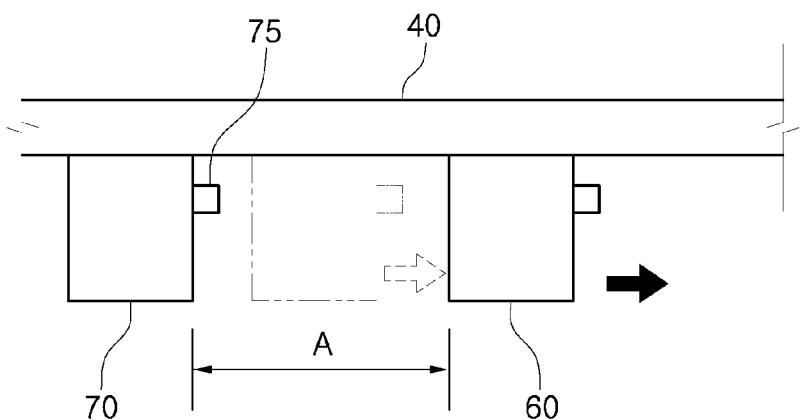

In order to describe the present disclosure, an operational advantage of the present disclosure, and the objective achieved by the realization of the present disclosure, hereinafter, preferred exemplary embodiments of the present disclosure will be illustrated, and are described with reference to the preferred exemplary embodiments.

First, the terms used in the present application are used only to describe specific exemplary embodiments, and are not intended to limit the present disclosure; and expressions in singular form may include the plural form unless the context clearly indicates otherwise. In addition, it will be further understood that the terms "comprise", "include", "have", etc. when used in the present application, specify the presence of features, integers, steps, operations, elements, components, and/or combinations of them stated in the specification, but do not preclude the possibility of the presence or addition of one or more other features, integers, steps, operations, elements, components, and/or combinations thereof.

In the following description of the present disclosure, detailed descriptions of related known functions and components incorporated herein will be omitted when it is determined that the subject matter of the present disclosure may be made to be obscured.

The present disclosure presents a solution in which it is possible to minimize a repetition of start and stop of vehicles, due to congestion on a track, by providing a buffer distance or a buffer waiting time, when a control target vehicle starts due to moving out of range of a proximity distance to a preceding vehicle, after stopping of the control target vehicle according to reaching of the proximity distance to the preceding vehicle, during driving the OHT control target vehicle.

The device for controlling the OHT vehicle according to the present disclosure may be configured to include: a preceding vehicle detector for detecting a separation distance from the preceding vehicle; and a vehicle motion controller for controlling operation of the control target vehicle on the basis of a preceding vehicle detection signal of the preceding vehicle detector.

Here, the vehicle motion controller decelerates and stops the control target vehicle according to reaching of a proximity threshold distance to the preceding vehicle, and starts the control target vehicle since a separation distance between the control target vehicle and the preceding vehicle exceeds a start separation distance considering a buffer distance or a buffer waiting time, which are additionally provided to the proximity threshold distance.

In addition, the preceding vehicle detector is equipped with a detection sensor for detecting a front obstacle such as the preceding vehicle, and a laser type UBG sensor as a photoelectric sensor for detecting obstacle or the like may be applied, and the preceding vehicle detector may be provided with a plurality of detection sensors at a plurality of positions as necessary. In addition, the preceding vehicle detector may include a sensor controller that sets a detection default of the detection sensor and controls sensing, and the sensor controller may be implemented with sensor firmware or the like.

Figure 3:
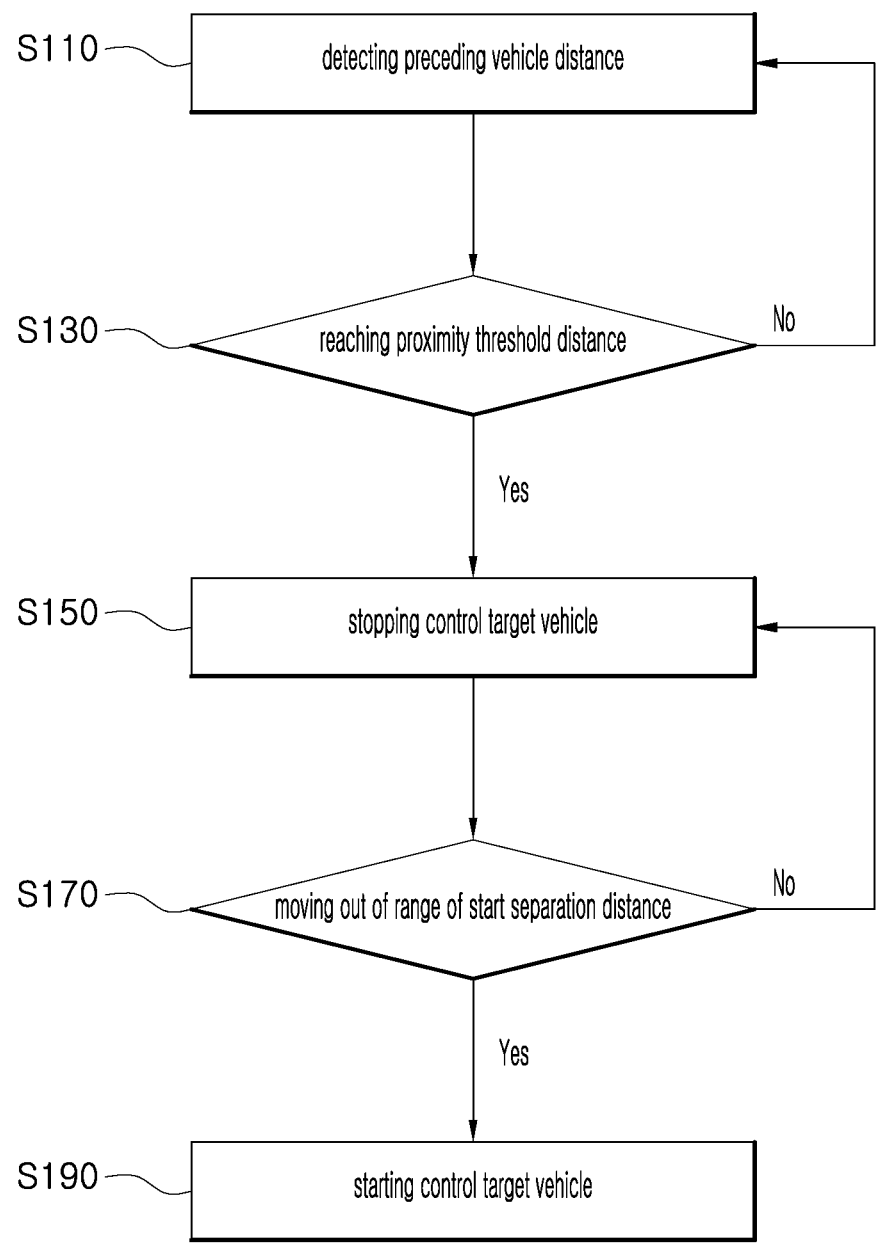
FIG. 3 is a view showing a schematic flowchart of a method of controlling an OHT vehicle according to the present disclosure.

As described above, the method of controlling the OHT vehicle through the device for controlling the OHT vehicle according to the present disclosure will be examined through a schematic flowchart shown in FIG. 3.

The OHT vehicle starts and runs in accordance with vehicle operation plan established in the OCS in accordance with vehicle operation command issued by the OCS, and in the case where a preceding vehicle exists on a track during driving a control target vehicle, a preceding vehicle detector installed on the control target vehicle detects a distance to the preceding vehicle (i.e., a step of S110) and transmits a detection signal to the vehicle motion controller when the distance to the preceding vehicle is reaching the proximity threshold distance (i.e., a step of S130).

The vehicle motion controller detects the reaching of the proximity threshold distance to the preceding vehicle according to the detection signal from the preceding vehicle detector, and decelerates and stops the control target vehicle (i.e., a step of S150).

In addition, when a detection signal from the preceding vehicle detector is transmitted according to the start of the preceding vehicle, the vehicle motion controller starts the control target vehicle on the basis of the detection signal, and at this time, the vehicle motion controller starts the control target vehicle (i.e., a step of S190) when a separation distance between the control target vehicle and the preceding vehicle moves out of range of the start separation distance obtained by adding a buffer distance or a buffer waiting time to the proximity threshold distance (i.e., a step of S170).

That is, in the present disclosure, when the control target vehicle is decelerated and stopped, whether to stop is controlled based on the proximity threshold distance to the preceding vehicle, but when the control target vehicle is started, whether to start is controlled based on the start separation distance obtained by adding the buffer distance or the buffer waiting time to the proximity threshold distance. Here, the buffer distance may be set based on the start acceleration of the preceding vehicle.

As described above, in the present disclosure, by adding a buffer distance when starting again after stopping of the OHT vehicle due to the proximity to the preceding vehicle, it is possible to solve the problem of vibrations caused by constant stops and starts due to reaching of the proximity distance between the OHT vehicles in the congestion section or the bottleneck section of the OHT vehicles, and in particular, by removing the section where acceleration reversal occurs, wherein the OHT vehicle decelerates as soon as accelerates, it is possible to solve the problem of a shock applied to a load by jerking caused by an instantaneous reverse action.

Hereinafter, the present disclosure will be described through various exemplary embodiments.

Figure 4:
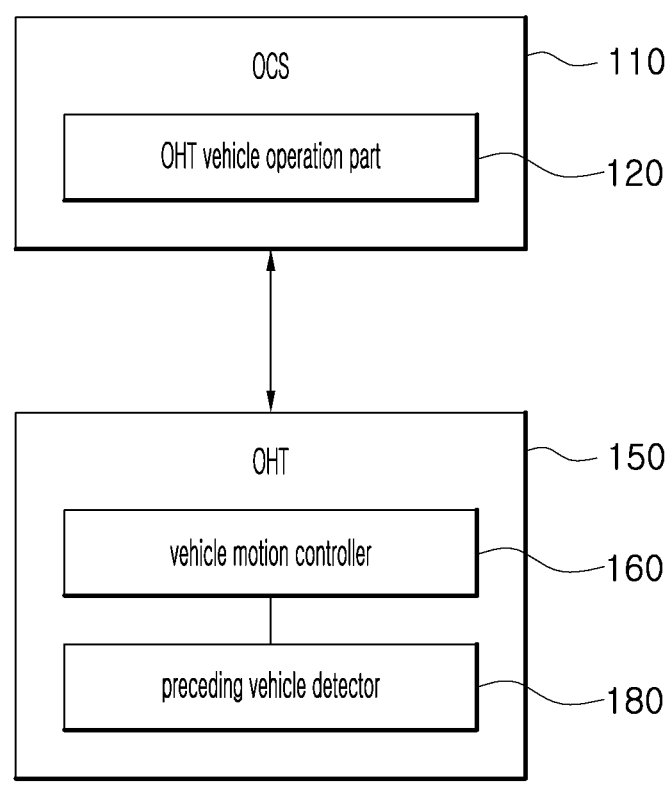
FIG. 4 is a view showing a configuration diagram for a first exemplary embodiment of a device for controlling an OHT vehicle according to the present disclosure.
Figure 5:
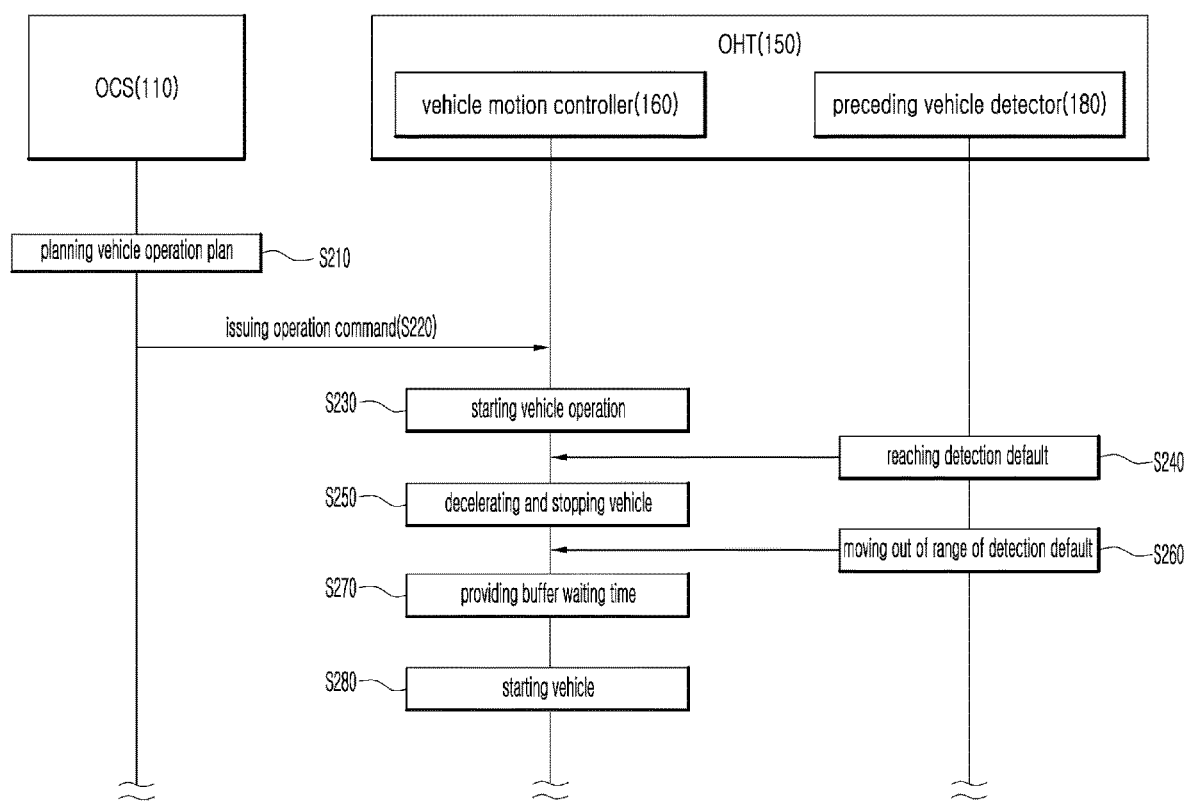
FIG. 5 is a view showing a flowchart for the exemplary embodiment of the method of controlling the OHT vehicle according to the present disclosure implemented through the first exemplary embodiment of FIG. 4.

FIG. 4 is a view showing a configuration diagram for a first exemplary embodiment of a device for controlling an OHT vehicle according to the present disclosure, and FIG. 5 is a view showing a flowchart for the exemplary embodiment of the method of controlling the OHT vehicle according to the present disclosure implemented through the first exemplary embodiment of FIG. 4.

The first exemplary embodiment of the device for controlling the OHT vehicle is an exemplary embodiment to which a way for providing a buffer waiting time corresponding to a buffer distance is applied, and similar to the basic configuration of the device for controlling the OHT vehicle of the present disclosure described above, the device for controlling the OHT vehicle 150 in the first exemplary embodiment may be configured to include: a preceding vehicle detector 180 that senses a separation distance from the preceding vehicle; and a vehicle motion controller 160 that controls deceleration, stopping, and starting of the control target vehicle according to the detection signal of the preceding vehicle detector 180.

The preceding vehicle detector 180 transmits the detection signal to the vehicle motion controller 160 in accordance with a detection default set as the proximity threshold distance to the preceding vehicle. Here, the preceding vehicle detector 180 detects both reaching of proximity to a preceding vehicle and moving out of range of the proximity upon start of the preceding vehicle, in accordance with a detection default based on the same proximity threshold distance.

When the vehicle motion controller 160 receives a detection signal according to reaching a proximity distance to the preceding vehicle from the preceding vehicle detector 180, the vehicle motion controller 160 decelerates and stops the control target vehicle. In addition, when transmitting the detection signal of moving out of range of the proximity threshold distance in accordance with the detection default received from the preceding vehicle detector 180, the vehicle motion controller 160 provides a buffer waiting time, based on the start acceleration of the preceding vehicle, and the buffer distance to start the control target vehicle according to exceeding of a start separation distance. Here, the buffer waiting time may be calculated by the following Equation 1, where $T_s$ is a buffer waiting time, $L_S$ is a buffer distance, and $a_F$ is acceleration of a preceding vehicle.

$$T_s = \sqrt{\frac{L_S}{a_F}} \quad \text{[Equation 1]}$$

That is, in the first exemplary embodiment, the vehicle motion controller 160 has a characteristic of starting the control target vehicle according to the exceeding of the start separation distance obtained by applying the buffer waiting time corresponding to the buffer distance.

As described above, the operation of the first exemplary embodiment will be described through referring to the flowchart of FIG. 5.

When vehicle operation plan from an OCS 110 is established (i.e., a step of S210) and an operation command is transmitted (i.e., a step of S220), the device for controlling the OHT vehicle 150 starts vehicle operation according to the vehicle operation plan (i.e., a step of S230).

According to start of operation of the control target vehicle, the preceding vehicle detector 180 detects a preceding vehicle on the same track, and transmits a detection signal to the vehicle motion controller 160 when a detection distance of the preceding vehicle reaches the proximity threshold distance set as the detection default (i.e., a step of S240). The vehicle motion controller 160 decelerates and stops the control target vehicle according to the detection signal of the vehicle motion controller 160 (i.e., a step of S250).

Thereafter, when the separation distance exceeds the proximity threshold distance due to the start of the preceding vehicle, the preceding vehicle detector 180 transmits a detection signal for the moving out of range of the proximity threshold distance (i.e., a step of S260), set as the detection default, to the vehicle motion controller 160.

The vehicle motion controller 160 provides a buffer waiting time, based on the start acceleration of the preceding vehicle, and the buffering distance according to a detection signal of the moving out of range of the proximity threshold distance (i.e., a step of S270) so as to delay start of the control target vehicle and maintain the stop during the buffer waiting time. Here, the buffer waiting time may be calculated according to the Equation 1.

In addition, the vehicle motion controller 160 starts the control target vehicle after a lapse of the buffer waiting time (i.e., a step of S280), and by providing such a buffer waiting time, the start of the control target vehicle is controlled based on the start separation distance obtained by adding an additional distance for the buffer waiting time to the proximity threshold distance.

As described above, in the first exemplary embodiment, as a method in which the vehicle motion controller provides a buffer waiting time corresponding to the buffer time, realization of the present disclosure becomes possible through a software configuration of the vehicle motion controller without adding or making a major change to an existing OHT system.

Figure 6:
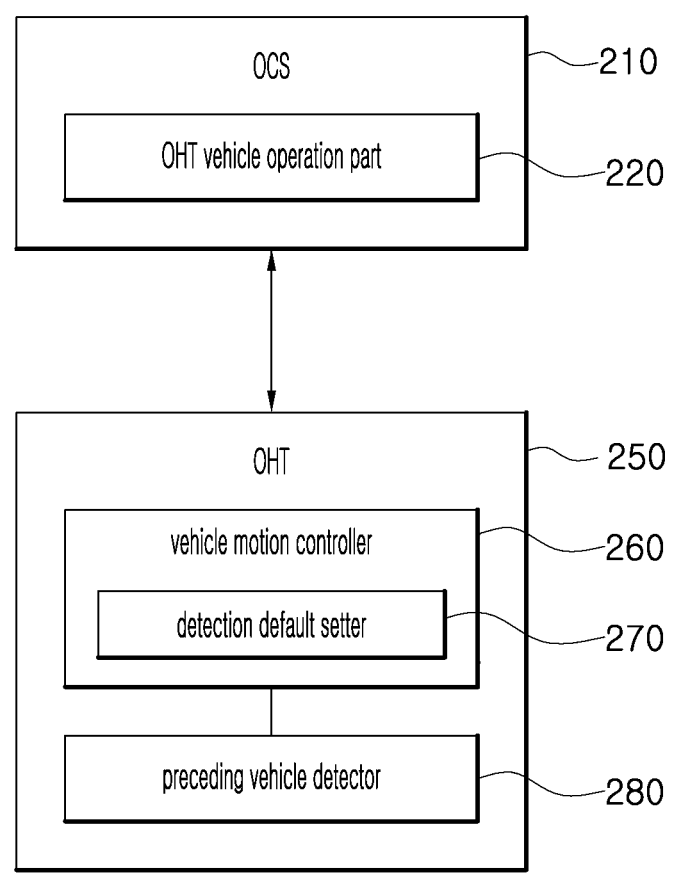
FIG. 6 is a view showing a configuration diagram for a second exemplary embodiment of a device for controlling an OHT vehicle according to the present disclosure.
Figure 7:
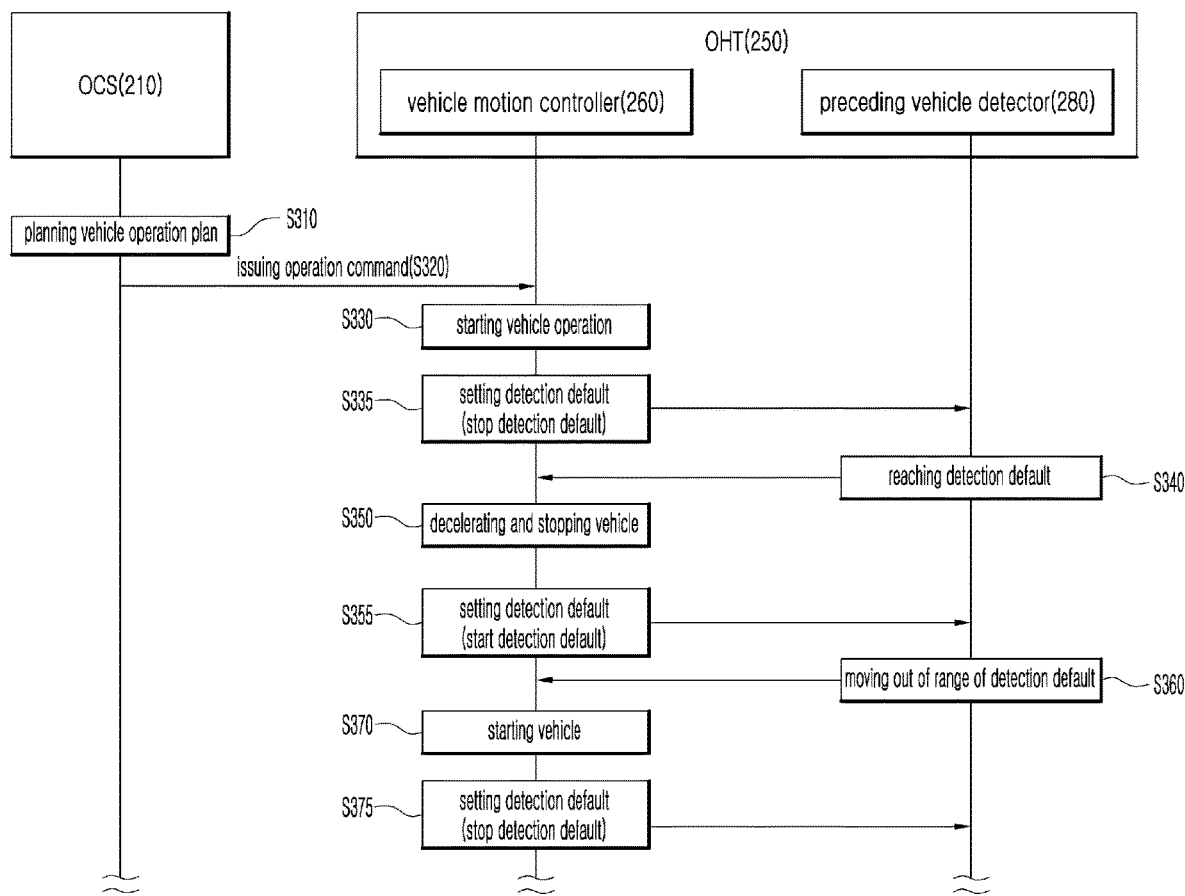
FIG. 7 is a view showing a flowchart for the exemplary embodiment of a method of controlling an OHT vehicle according to the present disclosure implemented through the second exemplary embodiment of FIG. 6.
Figure 8:
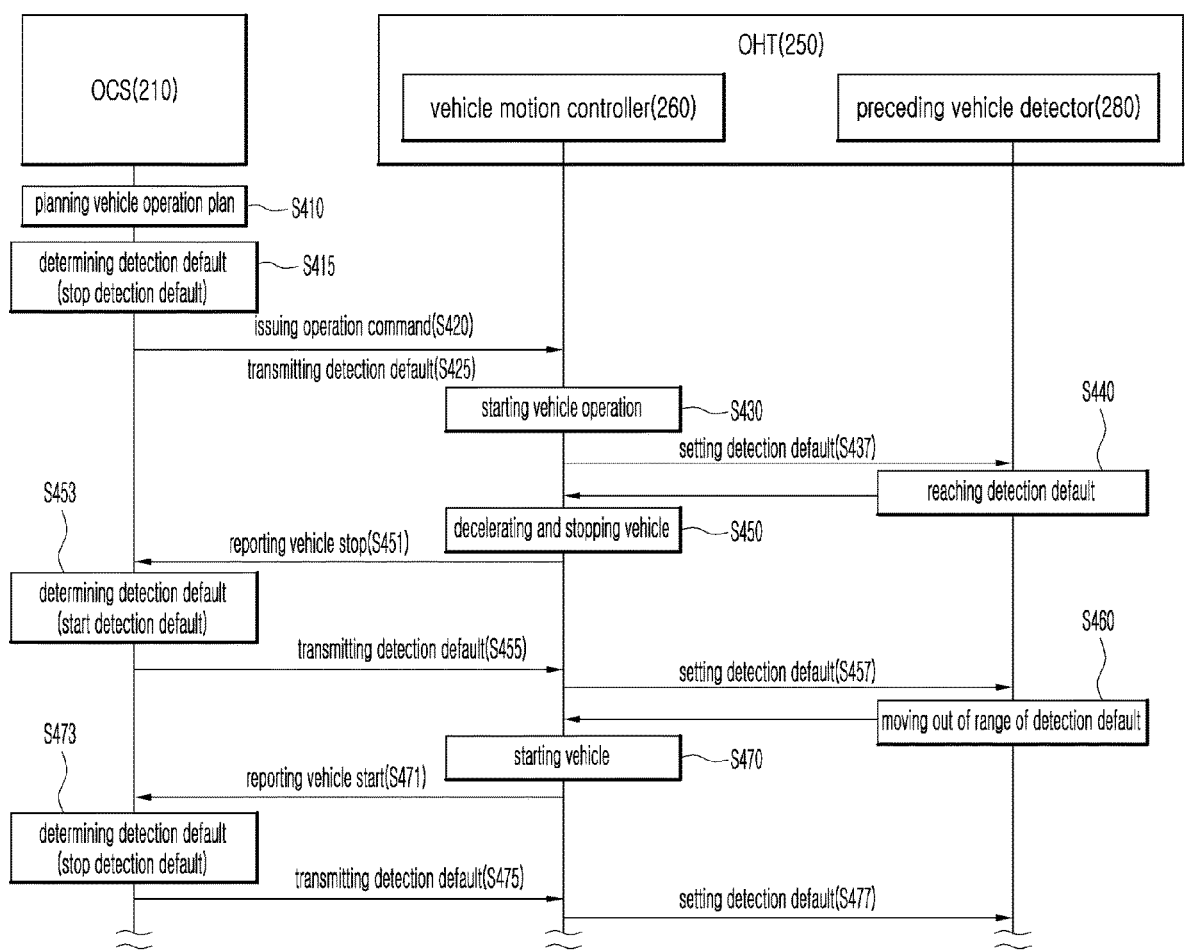
FIG. 8 is a view showing a flowchart for another exemplary embodiment of a method of controlling an OHT vehicle according to the present disclosure implemented through the second exemplary embodiment of FIG. 6.

FIG. 6 is a view showing a configuration diagram for a second exemplary embodiment of a device for controlling an OHT vehicle according to the present disclosure, and FIGS. 7 and 8 are flowcharts showing each of different exemplary embodiments of a method of controlling an OHT vehicle according to the present disclosure implemented through the second exemplary embodiment of FIG. 6.

The second exemplary embodiment of the device for controlling the OHT device shows an exemplary embodiment to which a method is applied, the method selectively resetting the detection default for the preceding vehicle detection sensor by distinguishing between a time when reaching proximity and a time when moving out of range of the proximity for the preceding vehicle.

In the second exemplary embodiment, a vehicle motion controller 260 of the device for controlling the OHT vehicle 250 includes: a detection default setter 270 selectively setting a detection default for preceding vehicle detection of a preceding vehicle detector 280 according to an operation situation of the control target vehicle.

The preceding vehicle detector 280 detects the reaching of the proximity and the moving out of range of the proximity of the preceding vehicle in accordance with the detection default selectively set by the detection default setter 270, and transmits a detection signal for the detected event to the vehicle motion controller 260. The vehicle motion controller 260 performs control to decelerate and stop, or performs control to start the control target vehicle according to the detection signal from the preceding vehicle detector 180.

A feature of the second exemplary embodiment is that when a preceding vehicle reaches the proximity, the preceding vehicle detector 280 detects the preceding vehicle according to a stop detection default based on the proximity threshold distance, and when the preceding vehicle moves out of range of the proximity, the preceding vehicle detector 280 detects the preceding vehicle according to a start detection default based on a start separation distance obtained by adding a buffer distance to the proximity threshold distance.

The detection default setting for the preceding vehicle detector 280 of the detection default setter 270 may be made according to a control command of the vehicle motion controller 260, or may be made according to a control command of the OCS 210 that plans and manages operation of the control target vehicle.

In the case where the detection default is set in accordance with the control command of the vehicle motion controller 260, the vehicle motion controller 260 determines which detection default is to be applied selectively according to the operation situation of the control target vehicle, and transmits a setting command of the detection default to the detection default setter 270, and accordingly, the detection default setter 270 selectively sets the detection default of the preceding vehicle detector 280 as the stop detection default or the start detection default.

Whereas, in the case where the detection default is set in accordance with the control command of the OCS 210, the vehicle motion controller 260 reports operation status of the control target vehicle to the OCS 210, and accordingly, may transmit the setting command of the detection default by determining which detection default is to be applied selectively by the OCS 210.

In more detail, when the control target vehicle is operated, a vehicle start report is transmitted to the OCS 210 to receive a stop detection default setting command from the OCS 210, and when the control target vehicle is stopped, a target vehicle stop report is transmitted to the OCS 210 to receive a start detection default setting command from the OCS 210, whereby the detection default setter 270 may selectively set the detection default of the preceding vehicle detector 280.

In relation to the operation of the second exemplary embodiment as described above, through referring to the flowchart of FIG. 7, the following will be described regarding a process in which the detection default setter 270 sets the detection default of the preceding vehicle detector 280 in accordance with the detection default setting command of the vehicle motion controller 260.

When vehicle operation plan is established from the OCS 210 (i.e., a step of S310) and an operation command is transmitted (i.e., a step of S320), the device for controlling the OHT vehicle 250 starts the vehicle operation in accordance with the vehicle operation plan (i.e., a step of S330).

At this time, with the start of the operation of the control target vehicle, the vehicle motion controller 260 transmits the stop detection default setting command to the detection default setter 270, and the detection default setter 270 sets the detection default of the preceding vehicle detector 280 as the stop detection default.

During the operation of the control target vehicle, the preceding vehicle detector 280 detects reaching of the proximity of the preceding vehicle in accordance with the stop detection default (i.e., a step of S340) and transmits the detection signal to the vehicle motion controller 260.

The vehicle motion controller 260 decelerates and stops the control target vehicle according to the detection signal of the preceding vehicle detector 280 (i.e., a step of S350). In addition, when the control target vehicle stops, the vehicle motion controller 260 transmits the start detection default setting command to the detection default setter 270, so that the detection default setter 270 sets again the detection default of the preceding vehicle detector 280 as the start detection default (i.e., a step of S355).

Thereafter, when a separation distance between the control target vehicle and the preceding vehicle reaches the start separation distance due to the start of the preceding vehicle, the preceding vehicle detector 280 transmits the detection signal for the moving out of range of the start separation distance (i.e., a step of S360) to the vehicle motion controller 260 in accordance with the start detection default set as the detection default.

The vehicle motion controller 260 starts the control target vehicle (i.e., a step of S370) according to the detection signal of the moving out of range of the start separation distance. In addition, the vehicle motion controller 260 transmits the stop detection default setting command to the detection default setter 270 upon the start of the control target vehicle, and the detection default setter 270 sets again the detection default of the preceding vehicle detector 280 as a stop detection default (i.e., a step of S375).

Next, in relation to the operation of the second exemplary embodiment, through referring to the flowchart of FIG. 8, the following will be described regarding a process in which the detection default setter 270 sets a detection default of the preceding vehicle detector 280 in accordance with a detection default setting command of the OCS 210.

In the exemplary embodiment of FIG. 8, as an example, when the OCS 210 holds stop detection default information and start detection default information, and selectively transmits corresponding default information together with a detection default setting command, the detection default setter 270 may set the detection default of the preceding vehicle detector 280. Alternatively, as another example, the device for controlling the OHT vehicle 250 holds the stop detection default information and the start detection default information, and extracts the corresponding default information in accordance with the detection default setting command from the OCS 210, whereby the detection default setter 270 may set the detection default of the preceding vehicle detector 280. The exemplary embodiment of FIG. 8 shows an exemplary embodiment that includes all of these cases.

When the vehicle operation plan is established in the OCS 210 (i.e., a step of S410), the OCS 210 determines a detection default to be applied (i.e., a step of S415), transmits an operation command (i.e., a step of S420), and transmits a detection default setting command (i.e., a step of S425). In this case, the stop detection default is applied as the detection default to be applied during the start and run of the control target vehicle, and the OCS 210 may directly transmit the default information on the stop detection default, or may only transmit the detection default setting command as the stop detection default.

According to the transmitting of the vehicle operation command of the OCS 210, the device for controlling the OHT vehicle 250 starts vehicle operation in accordance with the vehicle operation plan (i.e., a step of S430), and also in accordance with the detection default setting command from the OCS 210, the detection default setter 270 sets the detection default of the preceding vehicle detector 280 as the stop detection default (i.e., a step of S437).

During operation of the control target vehicle, the preceding vehicle detector 280 detects the reaching of the proximity of the preceding vehicle in accordance with the stop detection default (i.e., a step of S440), and transmits the detection signal to the vehicle motion controller 260.

Then, the vehicle motion controller 260 decelerates and stops the control target vehicle according to the detection signal of the preceding vehicle detector 280 (i.e., a step of S450), and reports the stop of the control target vehicle, in accordance with the stop detection default, to the OCS 210 (i.e., a step of S451).

The OCS 210 determines the detection default to be applied according to the vehicle stop report (i.e., a step of S453), and transmits the start detection default setting command as the detection default to be applied when starting again after stopping according to the reaching of the proximity threshold distance to the preceding vehicle (i.e., a step of S455). At this time, as described above, the OCS 210 may directly transmit the default information on the start detection default, or may transmit only the detection default setting command.

In accordance with the detection default setting command from the OCS 210, the detection default setter 270 sets the detection default of the preceding vehicle detector 280 as the start detection default (i.e., a step of S457).

Thereafter, when the separation distance reaches the start separation distance due to the start of the preceding vehicle, the preceding vehicle detector 280 transmits a detection signal for the moving out of range of the start separation distance (i.e., a step of S460) to the vehicle motion controller 260 according to the starting detection default set as the detection default.

The vehicle motion controller 260 starts the control target vehicle according to the detection signal of the moving out of range of the start separation distance (i.e., a step of S470), and transmits the start report of the control target vehicle to the OCS 210 (i.e., a step of S471).

Then, the OCS 210 determines a detection default to be applied according to the start report of the control target vehicle (i.e., a step of S473), and at this time, a stop detection default setting command is transmitted (i.e., a step of S475) as a detection default to be applied when reaching the preceding vehicle according to the moving out of range of the start separation distance from the preceding vehicle. As described above, the OCS 210 may directly transmit the default information for the stop detection default, or may transmit only the detection default setting command.

In accordance with the detection default setting command of the OCS 210, the detection default setter 270 sets again the detection default of the preceding vehicle detector 280 as the stop detection default (i.e., a step of S477), and accordingly, the preceding vehicle detector 280 detects the reaching of the proximity of the preceding vehicle in accordance with the stop detection default.

As described above, according to the second exemplary embodiment, an upper layer configuration is able to selectively change the detection default of the detection sensor without any change to the detection sensor installed previously, and also realization of the present disclosure may be possible through a software configuration without including additional components or major changes to the existing OHT system.

Figure 9:
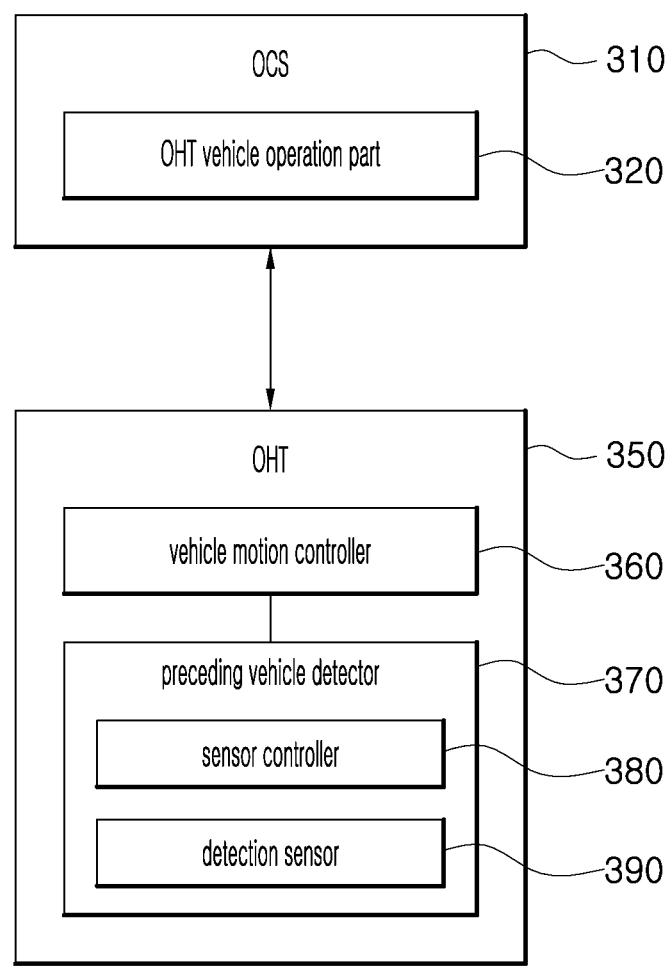
FIG. 9 is a view showing a configuration diagram for a third exemplary embodiment of a device for controlling an OHT vehicle according to the present disclosure.
Figure 10:
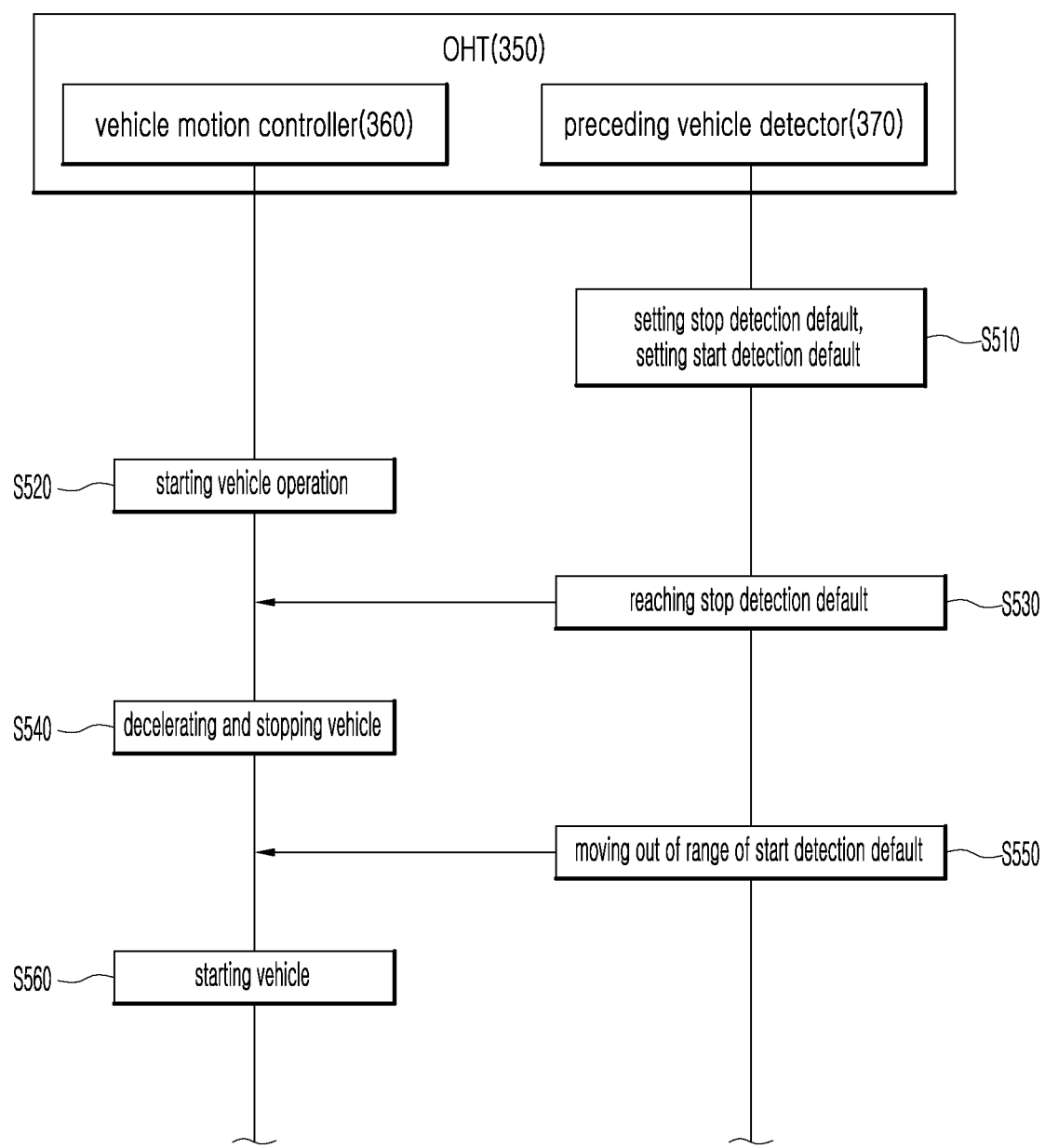
FIG. 10 is a view showing a flowchart for the exemplary embodiment of a method of controlling an OHT vehicle according to the present disclosure implemented through the third exemplary embodiment of FIG. 9.

FIG. 9 is a view showing a configuration diagram of a third exemplary embodiment of a device for controlling an OHT vehicle according to the present disclosure, and FIG. 10 is a flowchart showing an exemplary embodiment of a method of controlling an OHT vehicle according to the present disclosure implemented through the third exemplary embodiment of FIG. 9.

The third exemplary embodiment of the device for controlling the OHT vehicle describes an exemplary embodiment to which a method of setting a detection default of a detection sensor by a preceding vehicle detector itself is applied.

In the third exemplary embodiment, the preceding vehicle detector 370 includes: a detection sensor 390 that detects a separation distance from a preceding vehicle; and a sensor controller 380 that controls a detection signal of the detection sensor 390 by setting a stop detection default on the basis of a proximity threshold distance to the preceding vehicle and by setting a start detection default on the basis of a start separation distance obtained by adding a buffer distance to the proximity threshold distance. Here, the sensor controller 380 may be implemented with sensor firmware, so that detection default setting of the detection sensor 390 may be performed more simply and selectively.

In addition, a vehicle motion controller 360 of a device for controlling an OHT vehicle 350 decelerates and stops a control target vehicle according to the detection signal for the stop detection default from the preceding vehicle detector 370, and performs vehicle driving control for starting the control target vehicle according to the detection signal for the start detection default from the preceding vehicle detector 370.

The third exemplary embodiment is characterized in that the start detection default is set in the detection sensor itself on the basis of the start separation distance obtained by adding the buffer distance when the control target vehicle reaches the proximity of the preceding vehicle and then starts again.

In relation to the operation of the third exemplary embodiment as described above, through referring to the flowchart of FIG. 10, the following will be described regarding a process to which detection defaults different from each other are applied when stopping and starting of the control target vehicle in the preceding vehicle detector 370.

Even in the case of the exemplary embodiment of FIG. 10, the control target vehicle is operated in accordance with vehicle operation plan of the OCS 310, and since the operation of the OCS 310 is not a main feature of the third exemplary embodiment, an operation diagram except for the operation of the OCS 310 is shown in FIG. 10 and the description related to general operation of the OCS 310 will be omitted.

First, before vehicle operation of a control target vehicle starts, a sensor controller 380 of a preceding vehicle detector 370 sets a detection default of a detection sensor 390, and the sensor controller 380 sets a stop detection default on the basis of a proximity threshold distance and sets a start detection default on the basis of a start separation distance obtained by adding a buffer distance to the proximity threshold distance (i.e., a step of S510).

When such detection default setting of the preceding vehicle detector 370 is completed, the vehicle operation of the control target vehicle starts (i.e., a step of S520), and the preceding vehicle detector 370 detects the preceding vehicle according to the set detection default.

When a separation distance from the preceding vehicle reaches the proximity threshold distance set as the stop detection default during the operation of the control target vehicle, the preceding vehicle detector 370 transmits a detection signal according to the stop detection default to the vehicle motion controller 360.

Then, the vehicle motion controller 360 decelerates and stops the control target vehicle according to the detection signal according to the stop detection default of the preceding vehicle detector 370 (i.e., a step of S540).

Thereafter, when the separation distance from the preceding vehicle moves out of range of the start separation distance (i.e., a step of S550) due to the start of the preceding vehicle, the preceding vehicle detector 370 transmits the detection signal according to the start detection default to the vehicle motion controller 360.

In addition, the vehicle motion controller 360 starts the control target vehicle according to the detection signal according to the start detection default of the preceding vehicle detector 370 (i.e., a step of S560).

According to the third exemplary embodiment as described above, the detection default of the detection sensor is set as the stop detection default and the start detection default, so that the start detection default provided with an additional buffer distance is applied when starting again after stopping due to the reaching of the proximity of the preceding vehicle, whereby it is possible to further reduce the frequency of stopping and starting of vehicle operation.

Furthermore, the device for controlling the OHT vehicle according to the present disclosure described above may be implemented by executing a computer program that performs each step of the method of controlling the OHT vehicle according to the present disclosure as described above, and to this end, the device for controlling the OHT vehicle according to the present disclosure may be implemented by including the vehicle motion controller provided with a storage medium that stores the computer program for performing each step of the method of controlling the OHT vehicle according to the present disclosure.

Figure 11A:
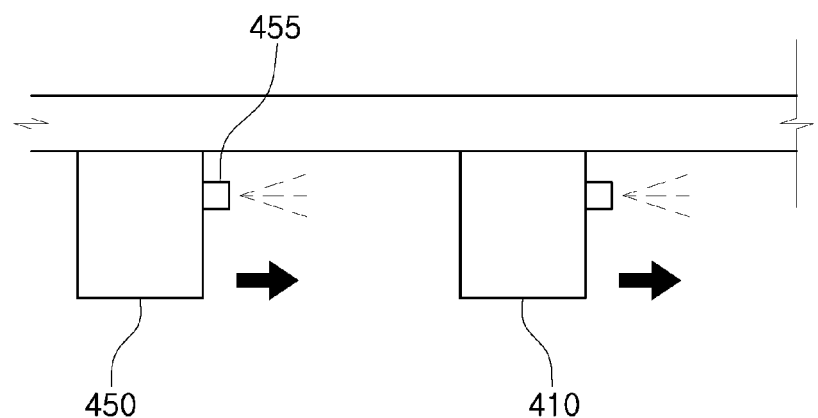
FIGS. 11A to 11C are views showing the exemplary embodiment in which a control target vehicle is controlled through the method of controlling the OHT vehicle according to the present disclosure.
Figure 11B:
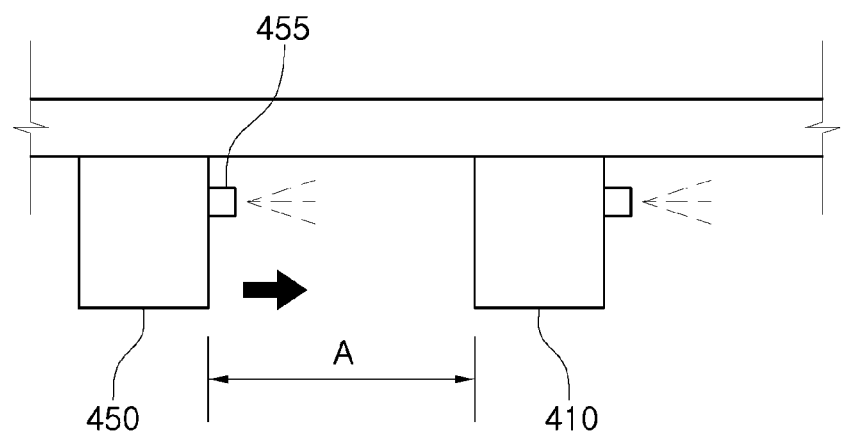
Figure 11C:
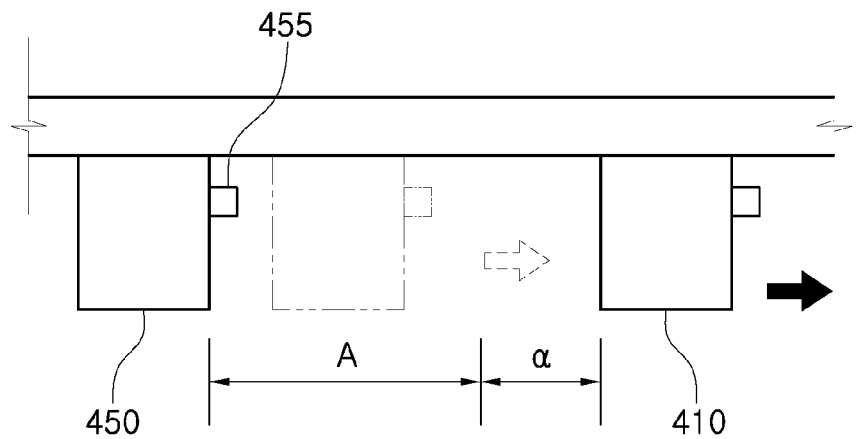

FIGS. 11A to 11C are views showing the exemplary embodiment in which the control target vehicle is controlled through the method of controlling the OHT vehicle according to the present disclosure.

As shown in FIG. 11A, while a preceding vehicle 410 and a following vehicle 450 are driving on the same track, the following vehicle 450 measures a distance from the preceding vehicle 410 through a preceding vehicle detection sensor 455 so as to operate while maintaining a predetermined distance.

As shown in FIG. 11B, in the case where the following vehicle 450 reaches a proximity threshold distance preset with the preceding vehicle 410, the vehicle motion controller decelerates and stops the following vehicle 450 in order to prevent a collision with the preceding vehicle according to the detection signal of the preceding vehicle detector.

Thereafter, as shown in FIG. 11C, when the preceding vehicle 410 starts and runs so that the separation distance between the preceding vehicle 410 and the following vehicle 450 moves out of range of the start separation distance A+α obtained by adding a buffer distance α to the proximity threshold distance A, the vehicle motion controller starts the following vehicle 450 again, and the operation of the following vehicle 450 is resumed.

According to the present disclosure as described above, when the following vehicle moves out of range of the proximity threshold distance due to the preceding vehicle starting again, after stopping as the following vehicle reaches the proximity distance to the preceding vehicle during driving the OHT vehicles, the following vehicle is made to start after providing an additional buffer distance or a buffer waiting time without starting the following vehicle immediately, thereby minimizing a repetition of start and stop of the OHT vehicles in the congestion section or the bottleneck section on the track.

In particular, it is possible to solve a problem in that vibrations are generated by constant stopping and starting due to the proximity distance between the OHT vehicles in the congestion section or the bottleneck section of the OHT vehicle, and to solve a problem in that a shock is applied to a load by jerking caused by instantaneous reverse action according to reversal of an acceleration change section by decelerating as soon as accelerating.

Although exemplary aspects of the present disclosure have been described for illustrative purposes, those skilled in the art will appreciate that various modifications, additions and substitutions are possible, without departing from essential characteristics of the disclosure. Therefore, the embodiments described in the present disclosure are not intended to limit the technical idea of the present disclosure but to describe the present disclosure, and the technical idea of the present disclosure is not limited by these embodiments. The scope of protection of the present disclosure should be interpreted by the following claims, and all technical ideas within the scope equivalent thereto should be construed as being included in the scope of the present disclosure.

What is claimed is:

1. A method of controlling an overhead hoist transfer (OHT) vehicle, the method comprising:
   stopping a control target vehicle in which a vehicle motion controller decelerates and stops the control target vehicle as the control target vehicle reaches a proximity threshold distance to a preceding vehicle;
   starting the control target vehicle in which the vehicle motion controller starts the control target vehicle as a separation distance between the control target vehicle and the preceding vehicle exceeds a start separation distance considering a buffer distance or a buffer waiting time;
   starting vehicle operation in which the vehicle motion controller receives a stop detection default setting command based on the proximity threshold distance, together with an operation command of the control target vehicle, from an overhead hoist transfer control system (OCS) that establishes an operation plan of the OHT vehicle and operates the OHT vehicle, sets a detection default of a preceding vehicle detector as a stop detection default, and starts operation of the control target vehicle, wherein the stopping of the control target vehicle comprises:
   receiving a detection signal of reaching the proximity threshold distance, in accordance with the stop detection default, from the preceding vehicle detector to decelerate and stop the control target vehicle, and transmitting a vehicle stop report to the OCS; and
   receiving a start detection default setting command, based on the start separation distance obtained by adding the buffer distance to the proximity threshold distance, from the OCS, and resetting the detection default of the preceding vehicle detector as the start detection default setting command, and
   wherein the starting of the control target vehicle comprises:
   receiving a detection signal of exceeding the start separation distance, in accordance with the start detection default setting command, from the preceding vehicle detector to start the control target vehicle, and transmitting a vehicle start report to the OCS; and
   receiving the stop detection default setting command from the OCS, and resetting the detection default of the preceding vehicle detector as the stop detection default.

2. The method of claim 1,
   wherein the buffer distance is set based on start acceleration of the preceding vehicle.

3. The method of claim 2,
   wherein the stopping of the control target vehicle comprises:
   receiving a detection signal, in accordance with a detection default set as the proximity threshold distance, from the preceding vehicle detector installed on the control target vehicle, and decelerating and stopping the control target vehicle, and wherein the starting of the control target vehicle comprises:
receiving a detection signal of exceeding the proximity threshold distance, in accordance with the detection default, from the preceding vehicle detector;
maintaining the stopping of the control target vehicle during the buffer waiting time based on the start acceleration of the preceding vehicle; and
starting the control target vehicle according to the exceeding of the start separation distance due to elapse of the buffer waiting time.

4. The method of claim 3,
wherein the buffer waiting time is calculated by an equation $$T_s = \sqrt{\frac{L_S}{a_F}},$$

where $T_s$ is the buffer waiting time, $L_S$ is the buffer distance, and $a_F$ is the acceleration of the preceding vehicle.

5. The method of claim 1,
wherein the stopping of the control target vehicle comprises:
receiving a detection signal, in accordance with a stop detection default based on the proximity threshold distance, from the preceding vehicle detector installed on the control target vehicle, and decelerating and stopping the control target vehicle; and
resetting a detection default of the preceding vehicle detector as a start detection default based on the start separation distance obtained by adding the buffer distance to the proximity threshold distance, and
wherein the starting of the control target vehicle comprises:
receiving the detection signal of exceeding the start separation distance, in accordance with the start detection default setting command, from the preceding vehicle detector, and starting the control target vehicle; and
resetting the detection default of the preceding vehicle detector as the stop detection default.

6. The method of claim 1,
wherein in the stopping of the control target vehicle, the vehicle motion controller extracts start detection default information held in accordance with the start detection default setting command from the OCS, and
wherein in the starting of the control target vehicle, the vehicle motion controller extracts stop detection default information held in accordance with the stop detection default setting command from the OCS.

7. The method of claim 1,
wherein in the stopping of the control target vehicle, the vehicle motion controller receives start detection default information together with the start detection default setting command from the OCS, and
wherein in the starting of the control target vehicle, the vehicle motion controller receives stop detection default information together with the stop detection default setting command from the OCS.

8. A device for controlling an overhead hoist transfer (OHT) vehicle, the device comprising:
a preceding vehicle detector configured to detect a separation distance from a preceding vehicle; and
a vehicle motion controller configured to control operation of a control target vehicle on the basis of a preceding vehicle detection signal of the preceding vehicle detector,
wherein the vehicle motion controller is configured to stop or start the control target vehicle based on a proximity threshold distance to the preceding vehicle and a start separation distance from the preceding vehicle,
wherein the vehicle motion controller comprises a detection default setter that selectively sets a detection default for preceding vehicle detection of the preceding vehicle detector according to an operation condition of the control target vehicle, and
wherein the detection default setter is configured to:
receive a detection default setting command from an overhead hoist transfer control system (OCS) that operates the OHT vehicle by establishing an operation plan of the OHT vehicle;
set the detection default of the preceding vehicle detector;
transmit, in response to operation of the control target vehicle, a vehicle start report to the OCS:
receive a stop detection default setting command from the OCS;
transmit, in response to the control target vehicle being stopped, a target vehicle stop report to the OCS; and
receive a start detection default setting command from the OCS.

9. The device for claim 8,
wherein the vehicle motion controller is configured to:
decelerate and stop, in response to the control target vehicle reaching the proximity threshold distance to the preceding vehicle, the control target vehicle, and
start, in response to the separation distance between the control target vehicle and the preceding vehicle exceeding the start separation distance, the control target vehicle, and
wherein a buffer distance or a buffer waiting time is considered in determining the separation distance between the control target vehicle and the preceding vehicle.

10. The device for claim 9,
wherein the buffer distance is set based on start acceleration of the preceding vehicle.

11. The device for claim 10,
wherein the preceding vehicle detector is configured to:
detect the preceding vehicle in accordance with a detection default set as the proximity threshold distance; and
transmit a detection signal to the vehicle motion controller, and
wherein the vehicle motion controller is configured to:
provide the buffer waiting time based on the start acceleration of the preceding vehicle; and
start, in response to the preceding vehicle exceeding the start separation distance, the control target vehicle, when a detection signal exceeding the proximity threshold distance in accordance with the detection default is transmitted from the preceding vehicle detector.

12. The device for claim 11,
wherein the buffer waiting time is calculated by an equation $$T_s = \sqrt{\frac{L_S}{a_F}},$$

where $T_s$ is the buffer waiting time, $L_S$ is the buffer distance, and $a_F$ is acceleration of the preceding vehicle.

13. The device for claim 8,
wherein the detection default setter is further configured to:
set a stop detection default on the basis of the proximity threshold distance when the control target vehicle is operated; and
set a start detection default on the basis of the start separation distance when the control target vehicle is stopped.

14. The device for claim 8,
wherein the detection default setter is further configured to:
extract, in response to the stop detection default setting command, stop
detection default information from the OCS; and
extract, in response to the start detection default setting command, start detection default information from the OCS.

* * * * *